United States Patent [19]

Samek et al.

[11] 4,312,004
[45] Jan. 19, 1982

[54] METHODS AND APPARATUS FOR RECORDING ELECTRIC SIGNALS

[75] Inventors: Norbert E. Samek, Sierra Madre; Thomas H. Garland, El Monte; Robert J. Connor, Duarte, all of Calif.

[73] Assignee: Bell & Howell Company, Chicago, Ill.

[21] Appl. No.: 36,612

[22] Filed: May 7, 1979

[51] Int. Cl.³ .............................................. G01D 15/14
[52] U.S. Cl. .................................... 346/1.1; 350/356; 350/387; 358/293; 346/108
[58] Field of Search .................... 346/108, 109, 1.1; 358/285, 293; 350/356, 387, 390, 393; 365/117

[56] References Cited

U.S. PATENT DOCUMENTS

| | | | |
|---|---|---|---|
| 3,245,083 | 4/1966 | Wilson | 346/109 |
| 3,666,666 | 5/1972 | Haertling | 350/150 X |
| 3,930,119 | 12/1975 | Schmidt | 35 0/150 X |
| 3,990,770 | 11/1976 | Carl | 350/356 X |
| 4,025,189 | 5/1977 | Pugsley | 355/38 |

FOREIGN PATENT DOCUMENTS

| | | |
|---|---|---|
| 1411846 | 10/1975 | United Kingdom . |
| 1465322 | 2/1977 | United Kingdom . |
| 1465673 | 2/1977 | United Kingdom . |
| 1492740 | 11/1977 | United Kingdom . |
| 1550576 | 8/1979 | United Kingdom . |
| 1534027 | 11/1978 | United Kingdom . |

OTHER PUBLICATIONS

Cutchen et al.; PLZT Electrooptic Shooters: Applications; Wescon Technical Papers, vol. 17, part 30, 1973, pp. 30/2 1-12.
Micheron et al.; Holographic Storage in Quadratic PLZT Ceramics, Journal of American Ceramic Society, vol. 57, No. 7, pp. 306-308.
Micheron et al.; Optical Recording of Digital Data in PLZT Ceramics, applied Physics Letters, vol. 24, No. 12, Jun. 1974, pp. 605-607.
Rouchon et al.; Photoinduced Caanbes of Refractive Index in PLZT Ceramics; Ferroelectrics; vol. 11, 1976, pp. 389-392.
Krumins et al.; Optically Induced . . . Ceramics; Ferroelectrics; vol. 18, 1978, pp. 21-26.
Kamzina et al.; Photoinduced Phenomenain . . . Transition; Ferroelectrics, vol. 18, 1978, pp. 113-116.
Levanyuk et al.; Theory of Photoinduced Changes . . . Polarization Ferroelectrics, vol. 18, 1978, pp. 147-151.
Cotchen et al.; PLZT Electrooptic Sautters: Applications Applied Optics; vol. 14, No. 8, Aug. 1975, pp. 1866 Et. Seq.

*Primary Examiner*—Joseph W. Hartary
*Attorney, Agent, or Firm*—Benoit Law Corporation

[57] ABSTRACT

Electric signals are recorded on a recording medium having a light sensitivity extending to wavelengths shorter than 475 nm, with an array of electrically switched lanthanum modified lead zirconate titanate (PLZT) light gates located between a light polarizer and a complementary light analyzer. The light gates are illuminated through the polarizer with light whose wavelength essentially is longer than 475 nm. Such light is selectively gated through electrically switched light gates through the analyzer and to the recording medium having a light sensitivity extending to wavelengths shorter than 475 nm. Information recordings may be made in this manner over extended periods of time without the typical performance degradation through photoinduced birefringence observed with conventional PLZT electrooptic shutters.

8 Claims, 2 Drawing Figures

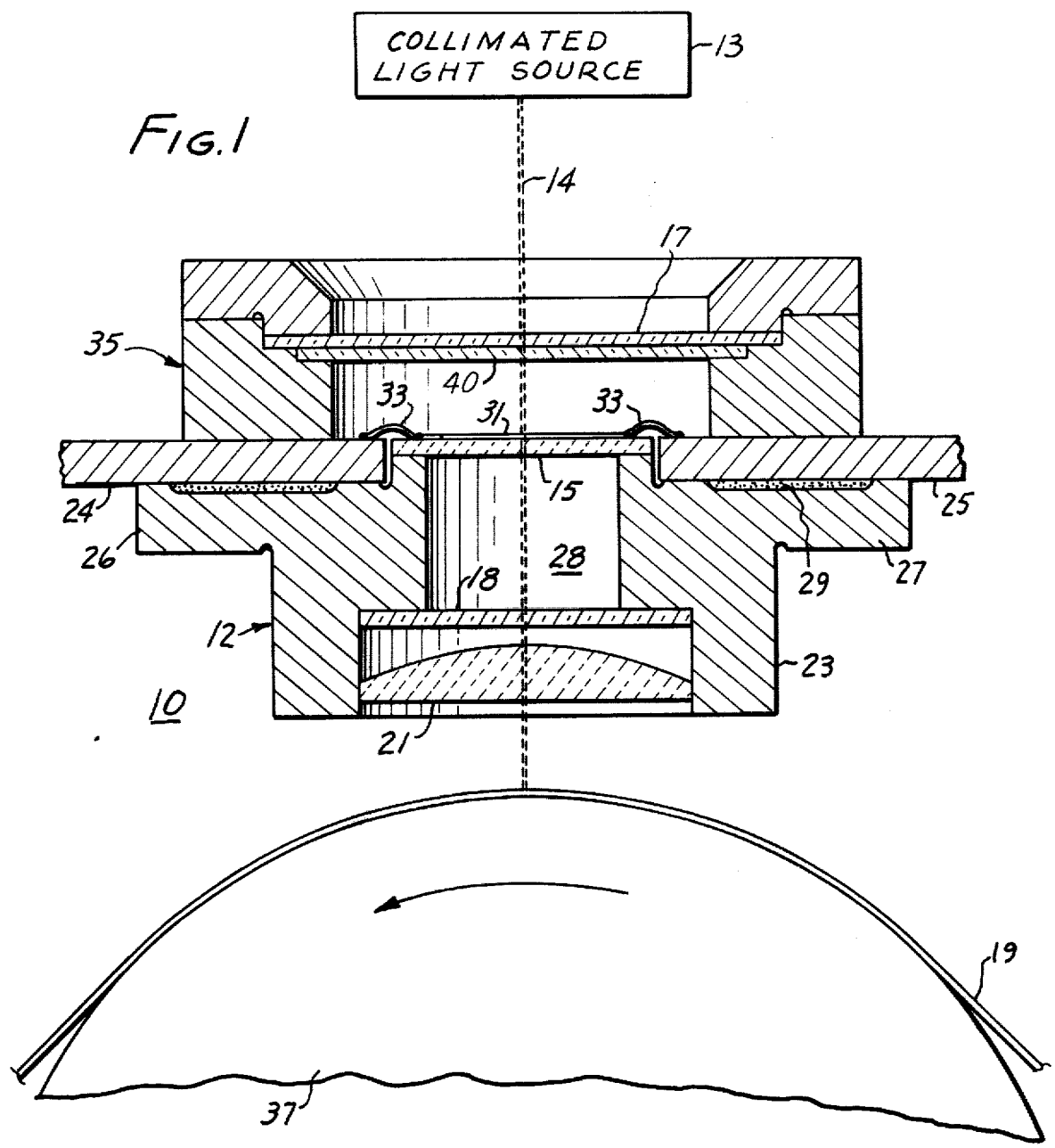

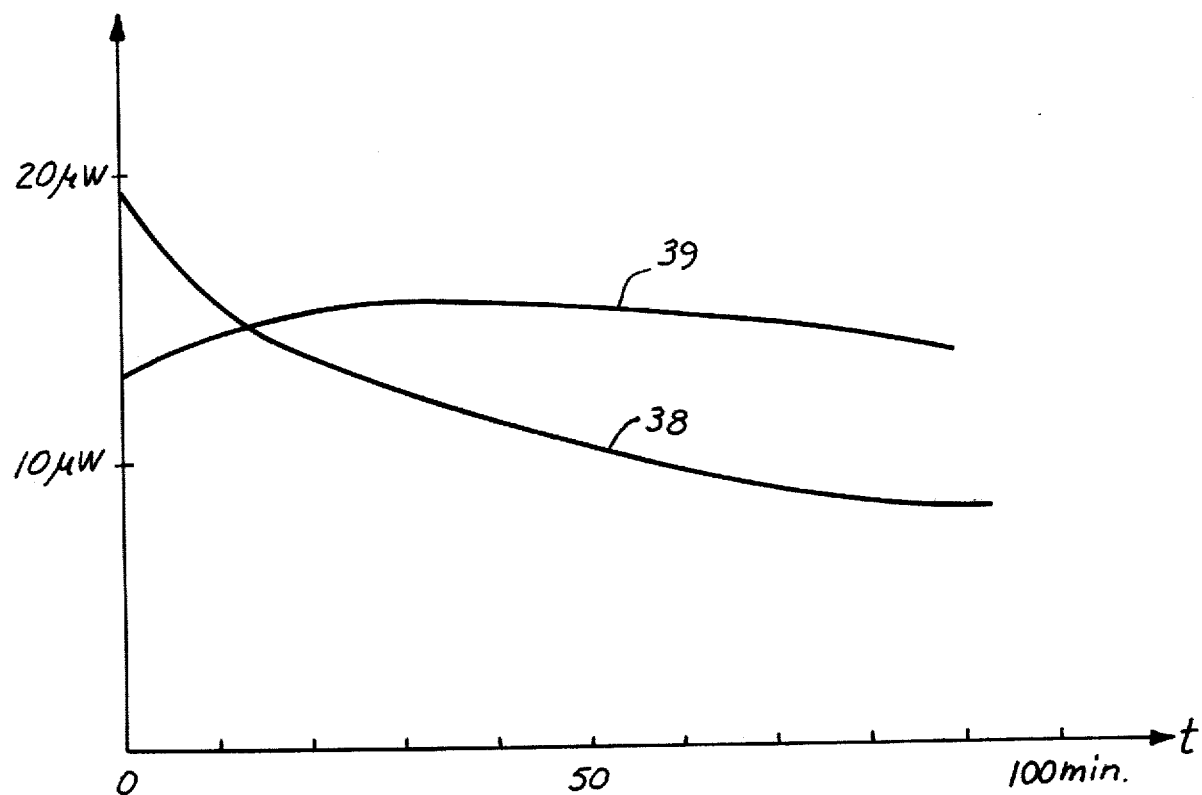

METHODS AND APPARATUS FOR RECORDING ELECTRIC SIGNALS

BACKGROUND OF THE INVENTION

1. Field of the Invention

The subject invention relates to the recording of electric signals and, more specifically, to methods and apparatus for recording electric signals on a light sensitive recording medium with the aid of electrically switchable light gates.

2. Disclosure Statement

This disclosure statement is made pursuant to the duty of disclosure imposed by law and formulated in 37 CFR 1.56(a). No representation is hereby made that information thus disclosed in fact constitutes prior-art inasmuch as 37 CFR 1.56(a) relies on a materiality concept which depends on uncertain and inevitably subjective elements of substantial likelihood and reasonableness, and inasmuch as a growing attitude appears to require citation of material which might lead to a discovery of pertinent material.

The photosensitive component, such as the silver halide system, used in photosensitive oscillograph papers or other photographic materials, has its highest sensitivity in the far blue and ultraviolet range; that is, at wavelengths below 475 nm (nanometers). Of course, photographic materials are frequently sensitized by dyes or otherwise rendered panchromatic to have a light sensitivity above the basic sensitivity of the photosensitive component. However, especially in the case of photosensitive oscillograph papers or other photographic recording media, the far blue and ultraviolet region is frequently relied on for high-sensitivity response.

In practice, such preference as to the recording medium is paired with a growing choice of the mercury arc lamp as light source for oscillograph apparatus and other light recording equipment. In fact, the mercury arc lamp which strongly radiates in the blue and ultraviolet region and photosensitive paper having a basic sensitivity in the same region, form a team in practice in a large number of oscillograph and other light recording apparatus.

In the context of oscillograph and other light recording apparatus, use has recently been made of electrooptically active solid-state materials for selectively gating light to the recording medium.

In this respect, various electrooptical light gate systems have been proposed for diverse fields of utility. For instance, an article by J. Thomas Cutchen et al, entitled Electrooptic Devices Utilizing Quadratic PLZT Ceramic Elements, published in 1973 Wescon Technical Papers, Vol. 17, part 30, pp. 30/2 et seq., and an article by the same authors entitled PLZT Electrooptic Shutters: Applications, APPLIED OPTICS, Vol. 14, No. 8 (August 1975), pp. 1866 et seq., describe electrooptic ceramics and devices employing transparent lanthanum-modified lead zirconate titanate (PLZT), and applications thereof, including page composers, display devices, eye protection devices, industrial welding protection, large aperture photographic shutters and variable density filters. Reference is also made to the extensive bibliography of these two articles, hereby incorporated by reference herein.

Facsimile apparatus for writing and reading mechanically moving documents with an electronically controllable switching mask plate, disposed between polarization filters and consisting of a material containing mixed crystals of lead zirconate and lead titanate, and doped with lanthanum, and provided with aligned electrodes, was proposed in U.S. Pat. No. 3,930,119, by Rolf Schmidt et al, issued Dec. 30, 1975.

A further proposal is apparent from British Patent Specification No. 1,534,027, by Battelle Memorial Institute, published Nov. 29, 1978. That proposal employs electrooptical light modulating devices preferably made of a PLZT ceramic material.

Improved light gate utilization methods and apparatus, with special optical systems, were disclosed in German Patent Publication No. 28 09 997, filed by the subject assignee, published Sept. 21, 1978, and herewith incorporated by reference herein.

Radically different from these proposals to employ PLZT and similar electrooptically active solidstate materials for light gating purposes are proposals to employ such materials for optical information storage or recording, with the particular material constituting the storage or information recording medium itself.

Reference may in this respect be had to an article by F. Micheron et al, entitled Holographic Storage in Quadratic PLZT Ceramics, Journal of the American Ceramic Society, Vol. 57, No. 7, pp. 306–08, an article by F. Micheron et al, entitled Optical Recording of Digital Data in PLZT Ceramics, Applied Physics Letters, Vol. 24, No. 12 (June 1974), pp. 605–07, an article by J. M. Rouchon et al, entitled Photoinduced Changes of Refractive Index in PLZT Ceramics, Ferroelectrics, Vol. 11 (1976), pp. 389–92, an article by A. E. Krumins et al, entitled Optically Induced Birefringence Change in La-Doped Lead Zirconate-Titanate Ferroelectric Ceramics, Ferroelectrics, Vol. 18 (1978), pp. 21–26, an article by L. S. Kamzina et al, entitled Photoinduced Phenomena in Lead Magnesium Niobate Crystal at the Diffuse Phase Transition, Ferroelectrics, Vol. 18 (1978), pp. 113–16, and an article by A. P. Levanyuk et al, entitled Theory of Photoinduced Changes in Refractive Index and Spontaneous Polarization, Ferroelectrics, Vol. 18 (1978), pp. 147–51.

In their above mentioned articles, Micheron et al and Rouchon et al report on techniques for holographic storage and optical recording in PLZT ceramics through photoinduced birefringence, and for an erasure of such recordings or of the photoinduced berefringence through illumination of the PLZT sample in the absence of an applied electric field. In particular, Micheron et al have pointed out that optical erasure with no external filed applied may be considered as a second recording. Krumins, Kamzina, Levanyuk et al report on similar experiments and supply theoretical explanations.

In the manufacture of PLZT electroded wafers, a suspension of light gating properties was observed when the wafers were subjected to ultraviolet exposure for cleaning purposes. This so-called "temporary UV blindness" disappeared upon annealing at 100° C. for one hour.

Prior to the subject invention, no connection was apparent between the above mentioned observations and theories on the one hand and a reduction of the light transmission of electrooptical solid-state light gates, particularly of the PLZT or ferroceramic type, upon prolonged operation, on the other hand.

Rather, the rule of thumb developed that the interelectrode spacing, that is, the spacing between immediately adjacent electrodes, should not be smaller than the thickness of the layer of electrooptically active material. It now appears in retrospect that the latter relationship provided a favorable distribution of the applied electric fields throughout the thickness of the electrooptically active material, thereby reducing what has now been recognized as photoinduced birefringence. However, the latter rule of thumb has continued to place severe restrictions on a reduction of interelectrode spacing for a given thickness of the electrooptically active substrate or layer, impeding attainment of desirable properties, such as high resolution.

SUMMARY OF THE INVENTION

It is a general object of this invention to overcome the disadvantages and to meet the needs apparent from the above Disclosure Statement or from other parts hereof.

It is a related object of this invention to provide improved methods and apparatus for recording electric signals or other information.

It is a germane object of this invention to provide improved methods and apparatus for recording electric signals or other information on a light sensitive recording medium with the aid of electrically switchable light gates.

It is also an object of this invention to inhibit photoinduced birefringence in electrooptical solid-state light gates particularly lanthanum modified lead zirconate titanate (PLZT) light gates operating with polarized light.

It is also an object of this invention to permit an increase in resolution of electrically switchable solid-state light gates.

Other objects will become apparent in the further course of this disclosure.

From a first aspect thereof, the subject invention resides in a method of recording electric signals on a recording medium having a light sensitivity extending from wavelengths longer than 475 nm to wavelengths shorter than 475 nm. The invention according to this aspect resides, more specifically, in the improvement comprising in combination the steps of providing an array of electrically switchable, lanthanum modified lead zirconate titanate (PLZT) light gates between a light polarizer and a complementary light analyzer, illuminating said light gates through said polarizer with a light whose wavelength essentially is longer than 475 nm within the light sensitivity of said recording medium, electrically switching light gates among the illuminated light gates with the electric signals to gate light whose wavelength essentially is longer than 475 nm selectively through switched illuminated light gates and the analyzer, and exposing the recording medium, having a light sensitivity extending to wavelengths shorter than 475 nm, to the selectively gated light whose wavelength essentially is longer than 475 nm.

From another aspect thereof, the subject invention resides in a method of recording electric signals on a recording medium having a light sensitivity extending from wavelengths longer than 475 nm to wavelengths shorter than 475 nm. The invention according to this aspect resides, more specifically, in the improvement comprising in combination the steps of providing an array of electrically switchable, lanthanum modified lead zirconate titanate (PLZT) light gates between a light polarizer and a complementary light analyzer, providing light having a wavelength shorter than, and a wavelength longer than, 475 nm within the light sensitivity of said recording medium, providing a filter in addition to said polarizer for blocking portions of the light having wavelengths shorter than 475 nm, illuminating the light gates through the filter and polarizer with the light thereby blocking out portions of the light having wavelengths shorter than 475 nm, electrically switching light gates among the illuminated light gates with the electric signals to gate light, having wavelengths shorter than 475 nm blocked out, selectively through the illuminated light gates and the analyzer, and exposing the recording medium, having a light sensitivity extending to wavelengths shorter than 475 nm, to the selectively gated light having wavelengths shorter than 475 nm blocked out.

From another aspect thereof, the subject invention resides in apparatus for recording electric signals on a recording medium having a light sensitivity extending from wavelengths longer than 475 nm to wavelengths shorter than 475 nm. The invention according to this aspect resides, more specifically, in the improvement comprising, in combination, an array of electrically switchable, lanthanum modified lead zirconate titanate (PLZT) light gates between a light polarizer and a complementary light analyzer, means for illuminating the light gates through the polarizer with light whose wavelength essentially is longer than 475 nm within the light sensitivity of said recording medium, means connected to the array for electrically switching light gates with the electric signals to gate light whose wavelength essentially is longer than 475 nm selectively through switched illuminated light gates and the analyzer, and means coupled to the recording medium for exposing the recording medium, having a light sensitivity extending to wavelengths shorter than 475 nm, to the selectively gated light whose wavelength essentially is longer than 475 nm.

From another aspect thereof, the subject invention resides in apparatus for recording electric signals on a recording medium having a light sensitivity extending from wavelengths longer than 475 nm to wavelengths shorter than 475 nm. The invention according to this aspect resides, more specifically, in the improvement comprising, in combination, an array of electrically switchable, lanthanum modified lead zirconate titanate (PLZT) light gates between a light polarizer and a complementary light analyzer, a source of light having a wavelength shorter than, and a wavelength longer than, 475 nm within the light sensitivity of said recording medium, means including a filter in addition to the polarizer for blocking portions of the light having wavelengths shorter than 475 nm, means for illuminating the light gates through the filter and polarizer with light from the source thereby blocking out portions having wavelengths shorter than 475 nm, means connected to the arrays for electrically switching light gates among the illuminated light gates with the electric signals to gate light, having wavelengths shorter than 475 nm blocked out, selectively through the illuminated light gates and the analyzer, and means coupled to the recording medium for exposing the recording medium, having a light sensitivity extending to wavelengths shorter than 475 nm, to the selectively gated light having wavelengths shorter than 475 nm blocked out.

BRIEF DESCRIPTION OF THE DRAWINGS

The subject invention and its objects and aspects will become more readily apparent from the following detailed description of preferred embodiments thereof, illustrated by way of example in the accompanying drawings, in which:

FIG. 1 is a diagrammatic view and a section through part of an electric signal recording apparatus pursuant to a preferred embodiment of the subject invention; and FIG. 2 is a comparative graph illustrating the operation of an embodiment of the subject invention.

DESCRIPTION OF PREFERRED EMBODIMENTS

The electric signal recording apparatus 10 of FIG. 1 comprises a light gate assembly 12 operating with a source 13 of collimated light 14. By way of example, but not by way of limitation, reference may be had to assignee's above mentioned German Patent Publication No. 28 09 997, disclosing electrooptical light gate structures and arrangements, together with various means and methods for illuminating same with collimated light. In this respect, while FIG. 1 symbolically shows a solid line at 14 for indicating the collimated light emitted by the source 13, it should be understood that such source illuminates the light gate array 15 with a band of light extending across and along the light gate array 15 as taught, for instance, in the above mentioned German Patent Publication.

The array 15 comprises a plurality of electrically switchable, lanthanum modified lead zirconate titanate (PLZT) light gates between a light polarizer 17 and complementary light analyzer 18. When no electric field is applied to the array 15, the light gates ideally are optically isotropic and exhibit no birefringence. Light 14 from the typically unpolarized source 13 is linearly polarized and proceeds through the PLZT material at 15, to be blocked by the analyzer 18. On the other hand, if one or more electric driving voltages or potentials are applied to the array 15, electric fields thus set up cause the PLZT material to become uniaxially birefringent. This birefringence causes a virtual rotation of the polarized light vector, thus allowing light to be transmitted via polarizer 17, light gate array 15 and analyzer 18 to a photosensitive recording medium or paper 19 in a manner known per se.

A lens or lens system 21 composed, for instance, of one or two elongate cylinder lenses, may be employed for focusing light traversing the analyzer 13 onto the recording paper 19.

A rigid beam 23 may be employed for mounting the light gate array 15 in the form of a substrate or chip consisting of electrooptically active PLZT light gate material, or having a layer of such material disposed on a transparent substrate.

Electric potentials for selectively switching the light gates are provided or generated externally of the array 15. To this end, the apparatus shown in FIG. 1 employs circuit boards 24 and 25 containing requisite light gate driver circuits and components (not shown). According to FIG. 1, the mounting beam 23 has extensions 26 and 27 extending laterally of the light transmitting opening or channel 28 for mounting the circuit boards 24 and 25, such as with the aid of a cement 29 or alternative fasteners. The array 15 has electrodes 31 for applying electric switching potentials to the light gates. As shown in several of the above mentioned references, herewith incorporated by reference herein, electrode arrays 31 may, for instance, be arranged in single aperture gate or dual aperture gate fashion. Jumpers or connecting wires 33 connect the electrodes 31 to the driver boards 24 and 25.

The apparatus 10 further has a separate mounting frame or housing 35 for the polarizer 17.

In practice, the light gate arrays 15 are illuminated with light 14 polarized at 17 and illuminated light gates are selectively switched through field-induced birefringence by selective application of electric signals or potentials produced externally of the arrays 15 by circuitry associated with the circuit boards 24 and 25. Light thus gated pursuant to the above mentioned polarization principles traverses the analyzer 18 and focusing lens 21 to impinge upon the recording paper 19 where it will leave a visible trace either after photographic development or practically immediately in the case of direct recording paper. In addition to oscillograph-type of recording, alphanumeric and facsimile-type recording is possible with the type of apparatus shown in FIG. 1. The recording medium or paper 19 is advanced continuously or intermittently past the recording station at the assembly 10 by or with the aid of a paper drum 37.

Reference may now be had to FIG. 2 which shows a light output (O) versus time (t) diagram in which the y-axis shows measured light output in microwatts ($\mu$W) and the x-axis shows time in minutes (min.).

In particular, curve 38 in FIG. 2 shows the result of measurements conducted with a light gate assembly 12 having a PLZT light gate array 15 mounted between a polarizer 17 and complementary analyzer 18. The light source 13 in that case was a mercury arc lamp as conventionally used in oscillograph apparatus. The recording medium 19 was a direct-print paper having a light sensitivity extending to wavelengths shorter than 475 nm.

In particular, the recording paper 19 had a sensitivity extending from about 360 nm to 620 nm, with an ultraviolet sensitivity peak at 390 nm and a further peak, followed by a sharp sensitivity drop-off at 570 nm. In other words, the curve 38 in FIG. 2 represents the situation in which an electrooptically active light gate material or array (15) is illuminated through a polarizer (17) with light having wavelengths not only in the visible range, but also in the ultraviolet region, for the purpose of recording on a photosensitive medium having a light sensitivity extending to the far blue and ultraviolet regions.

As apparent from the curve 38 in FIG. 2, the light output O, that is the through-put of the electrooptical gating structure, was at a maximum at the beginning of the exposure period but sharply declined thereafter to about half its original value in less than one hour of operation of the oscillograph equipment.

In sharp contrast to this degradation of performance, the curve 39 in FIG. 2 shows how the performance with time of the equipment improved very significantly when the light gate or arrays 15 were illuminated through the polarizer 17 with light whose wavelength essentially was longer than 475 nm. Comparing the curves 38 and 39, we can see at the vertical or y-axis that a certain initial light output diminution occurs if the light gates are illuminated with light whose wavelength essentially is longer than 475 nm. While we do not wish to be bound by any particular theory, this appears explicable by the fact that light which does not extend into the far blue or infrared region does not take full advantage of the entire sensitivity spectrum of the recording paper.

However, as the curve 39 in FIG. 2 clearly shows, an initial reduction in light output is more than offset in effect by a rather flat performance curve with time. In particular, the light output or through-put even improves somewhat with time, to fall off only very gradually with further time exposure. In fact, the curve 39 presents a practically constant gated light output or light gate through-put for all practical intents and purposes concerning oscillography, facsimile recording and similar endeavors.

Within the broad scope thereof, the subject invention may be practised by utilizing a collimated light source 13 which only emits light whose wavelength essentially is longer than 475 nm. For instance, a sodium vapor lamp with a glass bulb could be used as the source 13, since the glass bulb effectively blocks the part of the sodium vapor gas discharge spectrum located at a wavelength below the mentioned limit of 475 nm, while permitting transmission of the spectral component above that limit.

Alternatively, and in accordance with the preferred embodiment of the subject invention shown in FIG. 1, an optical filter 40 may be employed for eliminating from the collimated light 14, for all practical purposes, components of wavelengths shorter than 475 nm. In this respect, it should be recognized that the broad scope of the subject invention does not necessarily insist in categorically eliminating each and every wavelength component below 475 nanometers, as long as such a component would be too insignificant in requiring any blocking action.

Rather, the subject invention requires that the light gates 15 be illuminated through the polarizer 17 with light whose wavelength essentially is longer than 475 nanometer, with the term "essentially," as customary in patent practice, allowing for the presence of insignificant stray components or similar negligible radiation below 475 nm which cannot change the light output performance from the time characteristic signified by the curve 39 in FIG. 2. In other words, the function of the expression "essentially" as herein employed conforms to the function of that expression in chemical and metallurgical patent practice where it signifies a tolerance of incidental impurities which are outside of a restricted range, but which are insignificant in the context of the claimed invention.

As seen in FIG. 1, the filter 40 may cooperate with the polarizer 17 in blocking portions of the light 14 having wavelengths shorter than 475 nm. If the filter 39 is located after the polarizer 17 in terms of light flux as shown in FIG. 1, it may have to be oriented relative to the polarizer 17 to make sure that it does not perform any countervailing polarizing action of its own. If desired, the filter 40 could be associated with the light source 13 or could otherwise be situated upstream of the polarizer 17 in terms of light flux. Location of the filter 40 as shown in FIG. 1 is, however, presently preferred inasmuch as the polarizer will help to maintain possibly detrimental heating of the filter 40 by the light source at a minimum. If desired, the filter 40 could be moved closer to the light gate array 15 than as shown in FIG. 1.

While no limitation to or dependence on any particular theory is intended, it is presently believed that the major cause of the performance degradation illustrated by the curve 38 in FIG. 2 or otherwise herein mentioned, is light-induced or photoinduced birefringence. Such photoinduced birefringence, in turn, is believed to be due to photoexcitation of electrons in the illuminated region where electrons can reach the conduction state and drift under the influence of the applied field. Such photoinduced charge carriers are being trapped in the dark regions of the electrooptical material layer of the array 15, particularly in close proximity to the edges of the electrode deposits. In brief, the trapped photoinduced charge carriers generate a space charge field which acts against the field applied to the electrodes and gating regions. The localized charge at the boundary of the illuminated area grows at a rate proportionate to the difference of free carrier concentration in the illuminated and in the dark areas.

It is now also believed that illumination of the electrooptical material in the array 15 with light in the far blue and ultraviolet region effects ionization which causes charge drift to compensate for the externally applied electric field. At any rate, as, for instance, confirmed by the curve 39 in FIG. 2, eliminating from the illuminating light wavelengths shorter than 475 nm inhibits photoinduced birefringence to such an extent as to render it negligible.

This is even true if the spacing between immediately adjacent electrodes 31 in the light gate array 15 is made smaller than the thickness of the layer of electrooptically active material in the array 15. The subject invention thus effectively removes the existing severe restriction mentioned at the end of the above Disclosure Statement. In other words, the subject invention enables a substantial increase in the resolution of light gate array and information recording produced thereby, relative to what was previously thought attainable.

Filters suitable for the practice of the subject invention are those which in conjunction with the polarizer 17 block wavelengths below 475 nm. By way of example, a filter located in terms of blocking between a Schott filter GG 475 and GG 495 has yielded best results in practical tests. Such a filter, for instance, in the Kodalite Yellow filter made by Eastman Kodak Company.

The subject extensive disclosure will suggest or render apparent various modifications and variations within the spirit and scope of the subject invention to those skilled in the art.

We claim:

1. In a method of recording electric signals on a recording medium having a light sensitivity extending from wavelengths longer than 475 nm to wavelengths shorter than 475 nm, the improvement comprising in combination the steps of:
   providing an array of electrically switchable, lanthanum modified lead zirconate titanate (PLZT) light gates between a light polarizer and a complementary light analyzer;
   illuminating said light gates through said polarizer with light whose wavelengths essentially is longer than 475 nm within the light sensitivity of said recording medium;
   electrically switching light gates among said illuminated light gates with said electric signals to gate light whose wavelength essentially is longer than 475 nm selectively through switched illuminated light gates and said analyzer; and
   exposing said recording medium, having a light sensitivity extending to wavelengths shorter than 475 nm, to said selectively gated light whose wavelength essentially is longer than 475 nm.

2. In a method of recording electric signals on a recording medium having a light sensitivity extending from wavelengths longer than 475 nm to wavelengths shorter than 475 nm, the improvement comprising in combination the steps of:
- providing an array of electrically switchable, lanthanum modified lead zirconate titanate (PLZT) light gates between a light polarizer and a complementary light analyzer;
- providing light having a wavelength shorter than, and a wavelength longer than, 475 nm within the light sensitivity of said recording medium;
- providing a filter in addition to said polarizer for blocking portions of said light having wavelengths shorter than 475 nm;
- illuminating said light gates through said filter and polarizer with said light thereby blocking out portions of said light having wavelengths shorter than 475 nm;
- electrically switching light gates among said illuminated light gates with said electric signals to gate light, having wavelengths shorter than 475 nm blocked out, selectively through said illuminated light gates and said analyzer; and
- exposing said recording medium, having a light sensitivity extending to wavelengths shorter than 475 nm, to said selectively gated light having wavelengths shorter than 475 nm blocked out.

3. In apparatus for recording electric signals on a recording medium having a light sensitivity extending from wavelengths longer than 475 nm to wavelengths shorter than 475 nm, the improvement comprising in combination:
- an array of electrically switchable, lanthanum modified lead zirconate titanate (PLZT) light gates between a light polarizer and a complementary light analyzer;
- means for illuminating said light gates through said polarizer with light whose wavelength essentially is longer than 475 nm within the light sensitivity of said recording medium;
- means connected to said array for electrically switching light gates with said electric signals to gate light whose wavelength essentially is longer than 475 nm selectively through switched illuminated light gates and said analyzer; and
- means coupled to said recording medium for exposing said recording medium, having a light sensitivity extending to wavelengths shorter than 475 nm, to said selectively gated light whose wavelength essentially is longer than 475 nm.

4. In apparatus for recording electric signals on a recording medium having a light sensitivity extending from wavelengths longer than 475 nm to wavelengths shorter than 475 nm, the improvement comprising in combination:
- an array of electrically switchable, lanthanum modified lead zirconate titanate (PLZT) light gates between a light polarizer and a complementary light analyzer;
- a source of light having a wavelength shorter than, and a wavelength longer than, 475 nm within the light sensitivity of said recording medium;
- means including a filter in addition to said polarizer for blocking portions of said light having wavelengths shorter than 475 nm;
- means for illuminating said light gates through said filter and polarizer with light from said source thereby blocking out portions having wavelengths shorter than 475 nm;
- means connected to said arrays for electrically switching light gates among said illuminated light gates with said electric signals to gate light, having wavelengths shorter than 475 nm blocked out, selectively through said illuminated light gates and said analyzer; and
- means coupled to said recording medium for exposing said recording medium, having a light sensitivity extending to wavelengths shorter than 475 nm, to said selectively gated light having wavelengths shorter than 475 nm blocked out.

5. In a method for direct recording electric signals on direct recording paper having a light sensitivity extending from wavelengths longer than 475 nm to wavelengths shorter than 475 nm, the improvement comprising in combination the steps of:
- providing an array of electrically switchable, lanthanum modified lead zirconate titanate (PLZT) light gates between a light polarizer and a complementary light analyzer; and
- inhibiting photoinduced birefringence in said PLZT light gates by illuminating said light gates through said polarizer with light whose wavelength essentially is longer than 475 nm within the light sensitivity of said recording paper, electrically switching light gates among said illuminated light gates with said electric signals to gate light whose wavelengths essentially is longer than 475 nm selectively through switched illuminated light gates and said analyzer, and generating directly on said direct recording paper a directly visible record of said electric signals by exposing said recording paper, having a light sensitivity extending to wavelengths shorter than 475 nm, to said selectively gated light whose wavelength essentially is longer than 475 nm.

6. In a method of direct recordng electric signals on direct recording paper having a light sensitivity extending from wavelengths longer than 475 nm to wavelengths shorter than 475 nm, the improvement comprising in combination the steps of:
- providing an array of electrically switchable, lanthanum modified lead zirconate titanate (PLZT) light gates between a light polarizer and a complementary light analyzer;
- providing light having a wavelength shorter than, and a wavelength longer than, 475 nm within the light sensitivity of said recording paper; and
- inhibiting photoinduced birefringence in said PLZT light gates by providing a filter in addition to said polarizer for blocking portions of said light having wavelengths shorter than 475 nm, electrically switching light gates among said illuminated light gates with said electric signals to gate light, having wavelengths shorter than 475 nm blocked out, selectively through said illuminated light gates and said analyzer, and generating directly on said direct recording paper a directly visible record of said electric signals by exposing said recording paper, having a light sensitivity extending to wavelengths shorter than 475 nm, to said selectively gated light having wavelengths shorter than 475 nm blocked out.

7. In apparatus for direct recording electric signals on direct recording paper having a light sensitivity extending from wavelengths longer than 475 nm to wavelengths shorter than 475 nm, the improvement comprising in combination:

an array of electrically switchable, lanthanum modified lead zirconate titanate (PLZT) light gates between a light polarizer and a complementary light analyzer;

means for inhibiting photoinduced birefringence in said PLZT light gates, including means for illuminating said light gates through said polarizer with light whose wavelength essentially is longer than 475 nm within the light sensitivity of said recording paper;

means connected to said array for electrically switching light gates with said electric signals to gate light whose wavelength essentially is longer than 475 nm selectively through switched illuminated light gates and said analyzer; and means for generating directly on said direct recording paper a directly visible record of said electric signals by exposing said recording paper, having a light sensitivity extending to wavelengths shorter than 475 nm, to said selectively gated light whose wavelength essentially is longer than 475 nm.

8. In apparatus for direct recording electric signals on direct recording paper having a light sensitivity extending from wavelengths longer than 475 nm to wavelengths shorter than 475 nm, the improvement comprising in combination:

an array of electrically switchable, lanthanum modified lead zirconate titanate (PLZT) light gates between a light polarizer and a complementary light analyzer;

a source of light having a wavelength shorter than, and a wavelength longer than, 475 nm within the light sensitivity of said recording paper;

means for inhibiting photoinduced birefringence in said PLZT light gates, including a filter in addition to said polarizer for blocking portions of said light having wavelengths shorter than 475 nm and means for illuminating said light gates through said filter and polarizer with light from said source thereby blocking out portions having wavelengths shorter than 475 nm;

means connected to said arrays for electrically switching light gates among said illuminated light gates with said electric signals to gate light, having wavelengths shorter than 475 nm blocked out, selectively through said illuminated light gates and said analyzer; and means for generating directly on said direct recording paper a directly visible record of said electric signals by exposing said recording paper, having a light sensitivity extending to wavelengths shorter than 475 nm, to said selectively gated light having wavelengths shorter than 475 nm blocked out.

* * * * *